United States Patent
Hsu

Patent No.: US 6,324,060 B1
Date of Patent: Nov. 27, 2001

(54) HEAT TRANSFER INTERFACE

(76) Inventor: Hul Chun Hsu, 6F-3, No. 422, Sec. 2, Li Ming Rd., Tai Chung (TW)

( * ) Notice: Subject to any disclaimer, the term of this patent is extended or adjusted under 35 U.S.C. 154(b) by 0 days.

(21) Appl. No.: 09/637,877

(22) Filed: Aug. 15, 2000

(51) Int. Cl.$^7$ .................................................. H05K 7/20
(52) U.S. Cl. ......................... 361/705; 165/185; 174/16.3
(58) Field of Search .......................... 174/16.3; 165/80.3, 165/185; 257/706, 707, 713, 722; 29/890.03; 428/40.5, 41.3, 41.8, 220, 348, 349, 344, 389, 420; 361/702–705, 707–709, 717–719, 722

(56) References Cited

U.S. PATENT DOCUMENTS

| | | | | |
|---|---|---|---|---|
| 5,440,172 | * | 8/1995 | Sutrina | 257/712 |
| 5,729,052 | * | 3/1998 | Tonti et al. | 257/712 |
| 5,926,371 | * | 7/1999 | Dolbear | 361/704 |
| 5,930,893 | * | 8/1999 | Eaton | 29/890.03 |
| 5,999,407 | * | 12/1999 | Meschter et al. | 361/704 |
| 6,054,198 | * | 4/2000 | Bunyan et al. | |
| 6,084,775 | * | 7/2000 | Bartley et al. | 361/705 |
| 6,165,612 | * | 12/2000 | Misra | 428/344 |

OTHER PUBLICATIONS

IBM Tech Discl Bull vol. 21 No. 10 Mar. 1979, "Thermal—Pad", Hwang, pp. 4028.*

* cited by examiner

*Primary Examiner*—Gerald Tolin
(74) *Attorney, Agent, or Firm*—Rosenberg, Klein & Lee

(57) ABSTRACT

A heat transfer interface is disclosed. The surface of the heat dissipating panel of a radiator formed by a heat dissipating substrate is machined, and then a second heat transfer layer is added thereon. The heat transfer layer is connected to the heat dissipating substrate through plating, physical vapor deposition, hot forging, or soldering. The second heat dissipating layer is a thin layer for enhancing the lightness of the contact surface of the heat dissipating substrate, reducing the hole gap on the surface of the heat dissipating substrate, reducing the amount of the soft filling material, reducing the filling thickness of the soft filling material, increasing the heat spreading, and thus reducing contact resistance.

3 Claims, 5 Drawing Sheets

HEAT TRANSFER INTERFACE

FIELD OF THE INVENTION

The present invention relates to a heat transfer interface and especially to a structure for reducing the contact resistance between the heat dissipating substrate and the heat source.

BACKGROUND OF THE INVENTION

Many different structures are used to the heat dissipation of electronic elements. The primary structure used currently is a heat dissipating structure formed by folding aluminum pieces namely, forming, radiating fines directly from folding aluminum. The surface thereof is according to the required electronic element such a CPU. As shown in FIG. 1, a radiating plate 10 with a size approximately equal to the top surface of an electronic heat emitting element is arranged. The bottom of the radiating plate 10 has a heat conductive panel 12 the opposite side of which is extended with a plurality of parallel fins 11 arranged as a matrix for guiding heat from the electronic heat emitting element 5 by the surface of the heat conductive panel 12 then the heat is guided out through the fins 11. That is the fins having an area being several times of the surface area of the electronic heat emitting element serve to dissipate heat of the electronic heat emitting element. This is an economic and efficient heat dissipating way and is widely used. Since it is made of aluminum, it is light and no damage occurs on the surface of the electronic heat emitting element. However, with the improvement of the electronic heat emitting elements (for example, a CPU), the heat to be dissipated is increased, therefore, heat dissipation must be performed quickly. Namely, a lower thermal resistance is required for dissipating the heat from the chip of the electronic heat emitting element 5 for maintaining a normal operation of the electronic heat emitting element 5. However, it is known that the prior art design can not serve for this requirement.

This is because in the prior art design, in order to reduce contact thermal resistance of a heat transfer interface in the prior art heat sink or CPU cooler, the two contact surfaces are machined to be as smooth as possible, and meanwhile, a soft filling material, such as a thermal grease 3 or a thermal pad 4 is filled into the gaps on the surface due to the machining. However, the aforesaid way still generates a high thermal resistance in a high heat flux, since no proper way and structure to resolve this problem, thus, it is still used widely. Moreover, since in general, copper or aluminum is used in the heat dissipating substrate, it can be acquired easily and is cheap, and has a rich amount in the nature. While, since it is hard to smooth the copper and aluminum (viewed from a microscope). Moreover, an oxide film is easily formed after machined so as to increase thermal resistance.

Besides, in the prior art, oxide metal powders or nonmetal powders are used as the soft filling material, which has a bad heat conductivity. In general, it is worse than the heat dissipating substrate. Only the soft filling material is used to fill the gaps between the contact surface for reducing heat resistance, a micro view thereof is shown in FIG. 2. It is shown that in the prior art, a soft filling material, for example, thermal grease 3 or thermal pad 4, is used to fill in the heat conductive plate 12 of the radiating plate 10 of the radiator 1 to be in contact with the smooth surface of the electronic element 5. Further, as shown in FIG. 3, the connection of the radiator 10 and another radiator 10 is illustrated, wherein a layer of thermal grease 3 is clamped therebetween. Since thermal grease is beneficial in heat transfer, it is used generally. Because the roughness of the surface of the radiator 10 machined is large, i.e., the contact thermal resistance is large, thermal grease is necessary to reduced thermal resistance. However, the contact resistance remains large in this connecting way. Therefore, it is known the that defects of the prior art is a large thermal resistance.

SUMMARY OF THE INVENTION

Accordingly, the primary object of the present invention is to provide a heat transfer interface suitable in the connection of an electronic heat emitting element with a heat dissipating structure or a heat transfer interface between an electronic heat emitting element and a heat emitting element. A second heat transfer layer is added to a heat dissipating substrate of a heat dissipating structure. Therefore, the roughness of the surface of the heat dissipating substrate becomes smaller and the smoothness of the surface is increased.

In order to achieve the aforesaid object, the present invention provides a heat transfer interface. The surface of the heat dissipating panel of a radiator formed by a heat dissipating substrate is machined, and then a second heat transfer layer is added thereon. The heat transfer layer is connected to the heat dissipating substrate through plating physical vapor deposition, hot forging, or soldering. The second heat dissipating layer is a thin layer, in general, having a thickness of 0.001~0.030 mm, for enhancing the lightness of the contact surface of the heat dissipating substrate, reducing the hole gap on the surface of the heat dissipating substrate, reducing the amount of the soft filling material, reducing the filling thickness of the soft filling material, increasing the heat spreading and thus reducing contact resistance. Therefore, the filling amount of a soft filling material and the thickness thereof is increased. The bad contact due to partial unevenness is compensated. If a material of high anti-oxygen (such as diamond like coating) is used, then an oxide layer is hard to be generated after machining, and thus, the contact thermal resistance may be reduced.

In order to achieve the aforesaid object, the present invention provides a heat transfer interface. The surface of the heat dissipating panel of a radiator formed by a heat dissipating substrate is machined, and then a second heat transfer layer is added thereon. The heat transfer layer is connected to the heat dissipating substrate through plating, physical vapor deposition, hot forging, or soldering. The second heat dissipating layer is a thin layer for enhancing the lightness of the contact surface of the heat dissipating substrate, reducing the hole gap on the surface of the heat dissipating substrate, reducing the amount of the soft filling material, reducing the filling thickness of the soft filling material, increasing the heat spreading, and thus reducing contact resistance.

The various objects and advantages of the present invention will be more readily understood from the following detailed description when reading in conjunction with the appended drawing.

DETAILED DESCRIPTION OF THE PREFERRED EMBODIMENTS

Figure 4:
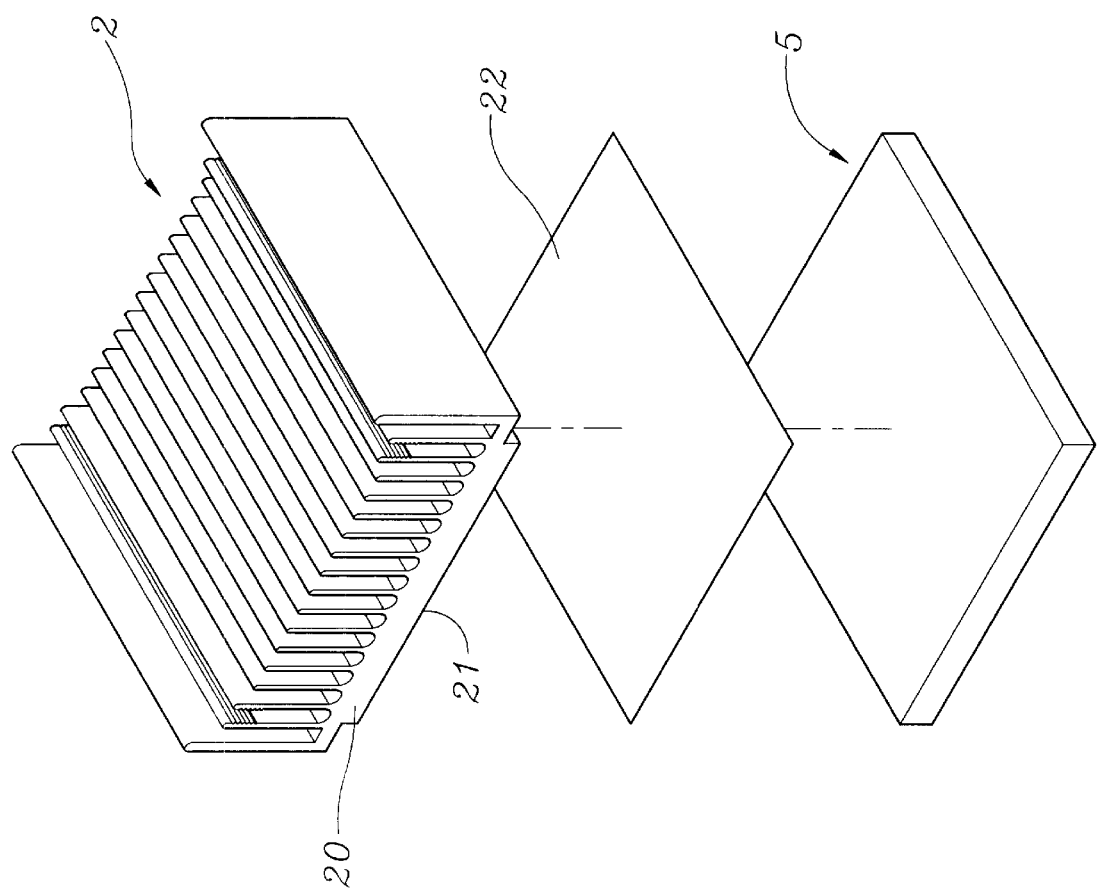
FIG. 4 is an exploded perspective view of the present invention.
Figure 5:
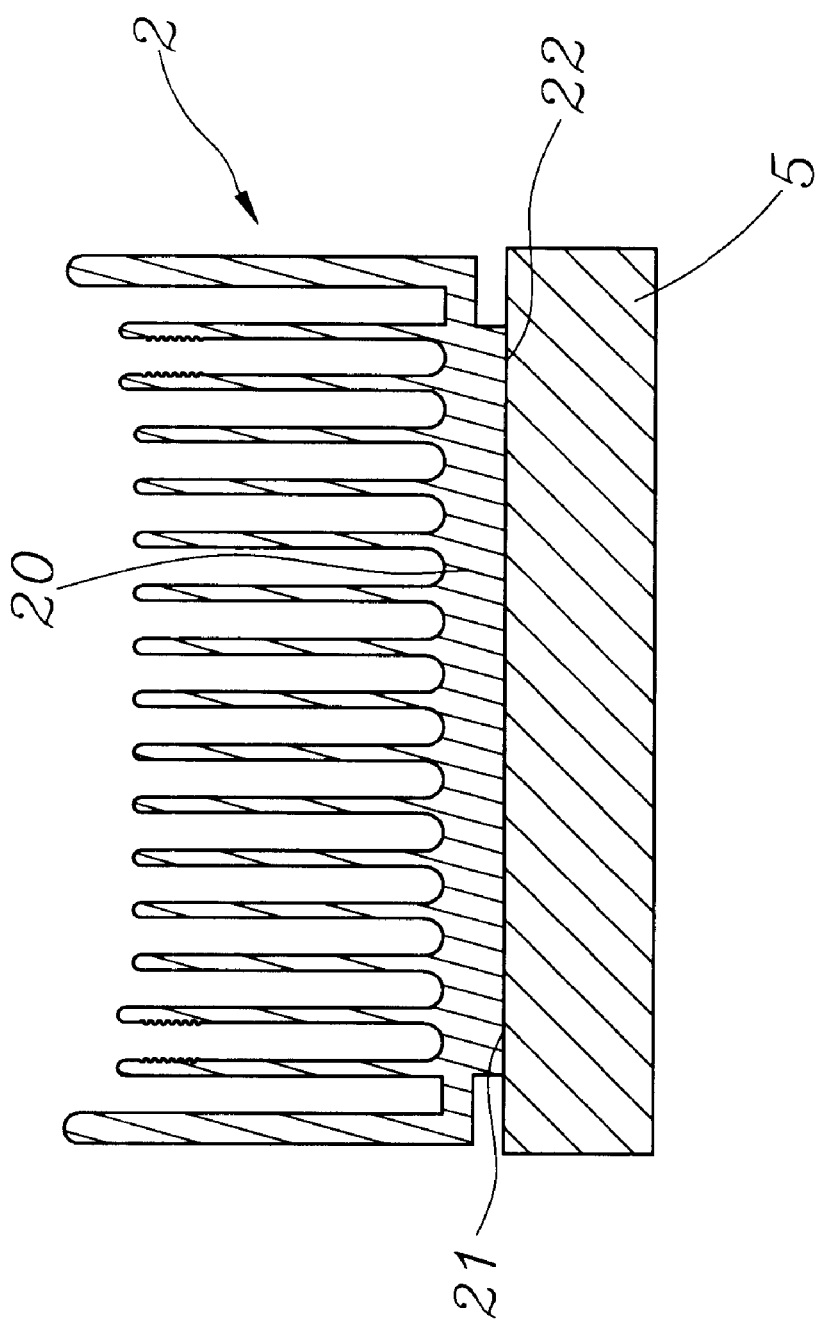
FIG. 5 is an assembled cross sectional view of the present invention.

With reference to FIGS. 4 and 5, a heat transfer interface of the present invention is illustrated herein. The surface of the heat dissipating panel 21 of a radiator 20 formed by a heat dissipating substrate 2 is machined, and then a second heat transfer layer 22 is added thereon. The surface of the heat dissipating substrate 2 is in contact with the surface of the heat emitting element 5 of a heat source. In general, the radiator 20 is a seat of a heat dissipating plate. The heat source is a kind of heat emitting element 5 (a central processing unit, a chip, or others of an electronic heat emitting element). It may be an electronic heat emitting element formed by another heat dissipating substrate. The heat conductivity of the second heat transfer layer 22 is larger than that of the heat dissipating substrate 2. The heat transfer layer 22 is connected to the heat dissipating substrate 2 through plating, physical vapor deposition, hot forging, or soldering. The second heat dissipating layer 22 is a thin layer, in general, having a thickness of 0.001~0.030 mm for enhancing the lightness of the contact surface of the heat dissipating substrate 2, reducing the hole gap on the surface of the heat dissipating substrate 2, reducing the amount of the soft filling material, reducing the filling thickness of the soft filling material, increasing the heat spreading, and thus reducing contact resistance.

Figure 1:
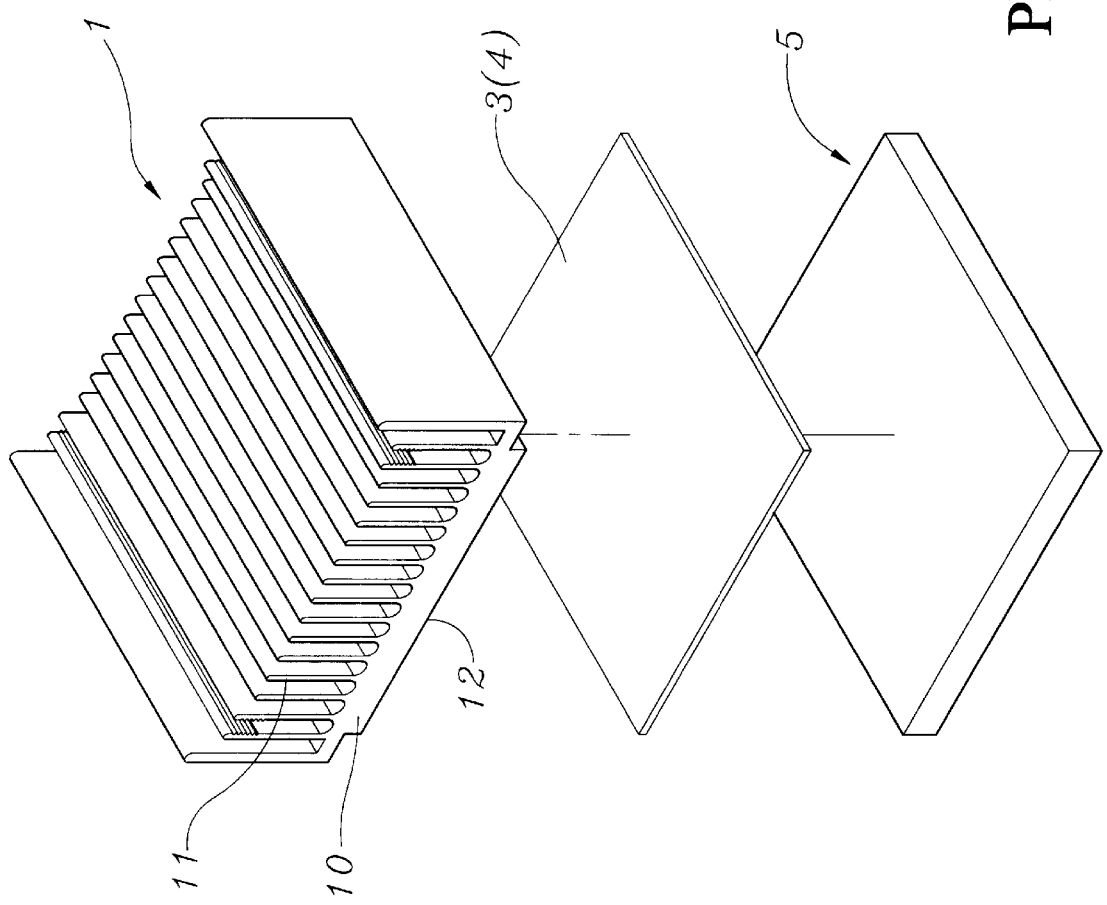
FIG. 1 is an exploded perspective view of the prior art.
Figure 3:
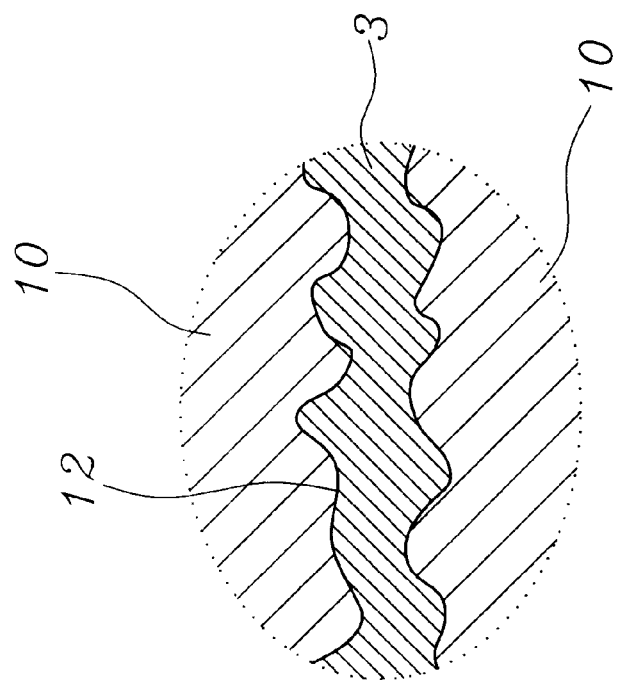
FIG. 3 is another partial enlarged view of the prior art.
Figure 2:
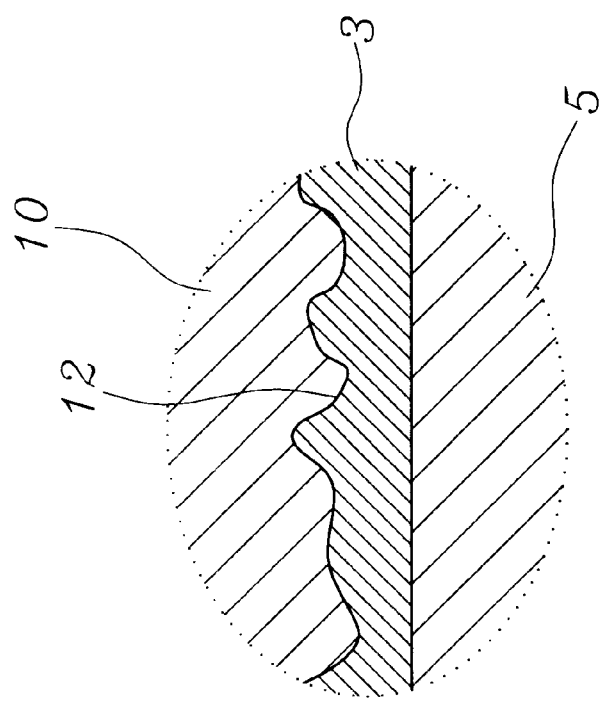
FIG. 2 is a partial enlarged view of FIG. 1.
Figure 7:
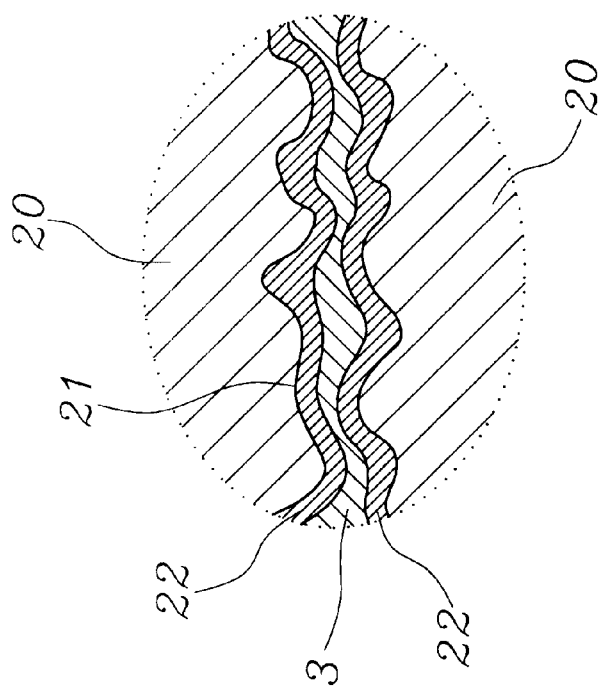
FIG. 7 is an enlarged cross sectional view of another embodiment in the present invention.
Figure 6:
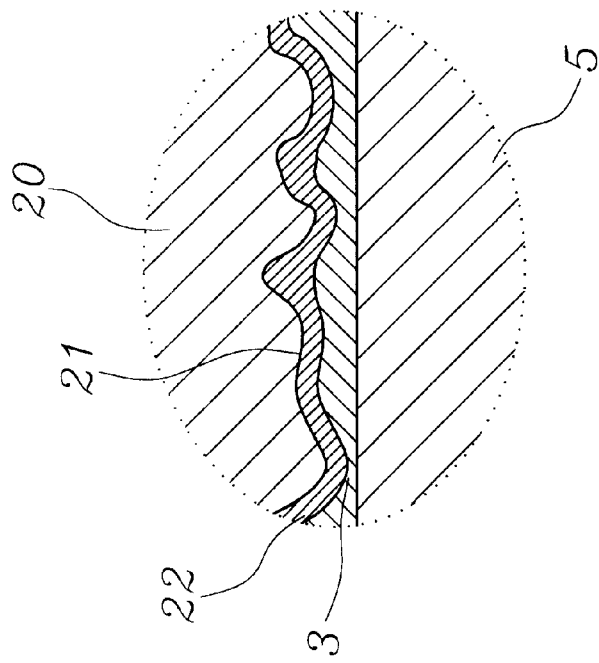
FIG. 6 is an partial enlarged view of FIG. 4 of the present invention.

FIG. 6 shows a partial enlarged view. The heat dissipating panel 21 of the heat dissipating substrate 2 has an irregular rough surface which is difficult to be smoothed, to be retained smooth after being smoothened and to be oxidized-proofed. Since air will be filled in this rough surface, and when the second heat transfer layer is added, most of the coarse surface will be filled. Since the roughness surface of the second heat transfer layer 22 is smaller, it can keep in contact with the surface of the chip packaging layer of the electronic heat emitting element 5. The thickness and amount of air between the second heat transfer layer 22 and the electronic heat emitting element 5 are reduced so that the contact resistance of the heat transfer interface decreases. Besides, the heat conductivity of the material adhered on the second heat transfer layer 22 is only larger than that of the soft filling material. The hardness and smooth of the heat transfer layer serves to reduce the filling amount of the soft filling material to the gaps and the thickness of the filled soft filling material so as to reduce the thermal resistance of the contact interface. The soft filling material is a layer of thermal grease 3. Since the thermal grease 3 is thinner, the coated thermal grease has a thickness very smaller than that coated in the prior art. The sum of the thickness of the two layers is smaller than the thickness in the prior art. Therefore, the thermal resistance in the contact surface is reduced greatly. Further, FIG. 7 shows another use. The use of two heat dissipating substrates 2 is illustrated. Tile combination of the thermal grease 3 of the soft filling material with the second heat transfer layer 22 of the heat dissipating substrate 2 is shown in the figure. Therefore, when the FIGS. 6 and 7 are contrasted with the FIGS. 2 and 3, the function of the present invention is illustrated. Besides, the soft filling material can be not used in the present invention. Thus, a direct contact is formed and thus thermal resistance is reduced.

In summary, in the present invention, the combination structure in the bottom of a heat dissipating substrate is processed by a combination material, so that a material with a larger thermal resistance is replaced by a material with a smaller resistance for reducing the generation of thermal resistance. In brief, a heat transfer layer is added. Thereby, a heat emitting element or another heat dissipating element has a lower thermal resistance. Then, heat is exhausted out through a radiator. Tile present invention is a direct heat transfer, which is greatly different from the indirect heat transfer structure of the prior art design because only a thin layer is added in the present invention, while in the prior art, two or three layers are necessary. This is because the prior art only increases the heat spreading but increase the contact thermal resistance and the height of the structure. Therefore, the present invention provides a preferred heat transfer which is better than that in the prior art, and thus provides a better heat dissipation and a good use. The heat of the heat emitting element is transferred out with a lower thermal resistance (a small temperature difference). Therefore, the present invention is completely different from the prior art. Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A heat transfer interface, comprising:

a heat source having a heat emitting surface;

a heat dissipating substrate having a heat dissipating panel formed thereon mounted on said heat emitting surface;

a first coating layer of a diamond material having a higher thermal conductivity than that of said heat dissipating substrate formed on said heat dissipating panel, said first coating layer at least partially filling surface irregularities in said heat dissipating panel; and, a layer of a thermal grease disposed between said first coating layer and said heat emitting surface.

2. The heat transfer interface as recited in claim 1, wherein said first coating layer has a thickness within a range of 0.001–0.030 mm.

3. The heat transfer interface as recited in claim 1, further comprising a second coating layer of said material of said first coating layer formed on said heat emitting surface.

* * * * *